United States Patent
Whitefield et al.

(10) Patent No.: US 6,986,112 B2
(45) Date of Patent: Jan. 10, 2006

(54) METHOD OF MAPPING LOGIC FAILURES IN AN INTEGRATED CIRCUIT DIE

(75) Inventors: Bruce Whitefield, Camas, WA (US); Joseph Cowan, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 190 days.

(21) Appl. No.: 10/628,986

(22) Filed: Jul. 28, 2003

(65) Prior Publication Data

US 2005/0028115 A1    Feb. 3, 2005

(51) Int. Cl.
*G06F 17/50* (2006.01)
(52) U.S. Cl. ............... 716/4; 716/5; 716/8; 716/11
(58) Field of Classification Search .......... 716/4–5, 716/7–15; 702/104; 714/738
See application file for complete search history.

(56) References Cited

U.S. PATENT DOCUMENTS

| | | | |
|---|---|---|---|
| 4,752,887 A * | 6/1988 | Kuwahara ................ 716/15 |
| 5,032,991 A * | 7/1991 | Davidson et al. ......... 716/15 |
| 5,392,222 A | 2/1995 | Noble |
| 5,568,563 A | 10/1996 | Tanaka et al. |
| 5,572,636 A | 11/1996 | Sakuraba et al. |
| 5,644,500 A * | 7/1997 | Miura et al. .............. 716/8 |
| 5,731,986 A | 3/1998 | Yang |
| 5,751,581 A | 5/1998 | Tau et al. |
| 5,841,664 A * | 11/1998 | Cai et al. .................. 716/14 |
| 5,847,965 A * | 12/1998 | Cheng ...................... 716/9 |
| 5,870,590 A * | 2/1999 | Kita et al. ................ 716/4 |
| 5,923,564 A * | 7/1999 | Jones, Jr. ................. 716/6 |
| 6,542,842 B2 * | 4/2003 | Godler et al. ............ 702/104 |
| 6,842,714 B1 * | 1/2005 | Acar et al. ............... 702/136 |
| 2005/0022085 A1 * | 1/2005 | Vo et al. .................. 714/738 |

* cited by examiner

*Primary Examiner*—Vuthe Siek
(74) *Attorney, Agent, or Firm*—Fitch Even Tabin & Flannery

(57) ABSTRACT

A method of mapping logic failures in an integrated circuit die includes generating a navigation map of test paths for an integrated circuit die, selecting a grid spacing to define a grid map of cell locations from the navigation map for each of the test paths, and calculating a value for each of the cell locations that is representative of the difference between a total number of the test paths intersecting each of the cell locations and a failed number of the test paths intersecting each of the cell locations.

20 Claims, 4 Drawing Sheets

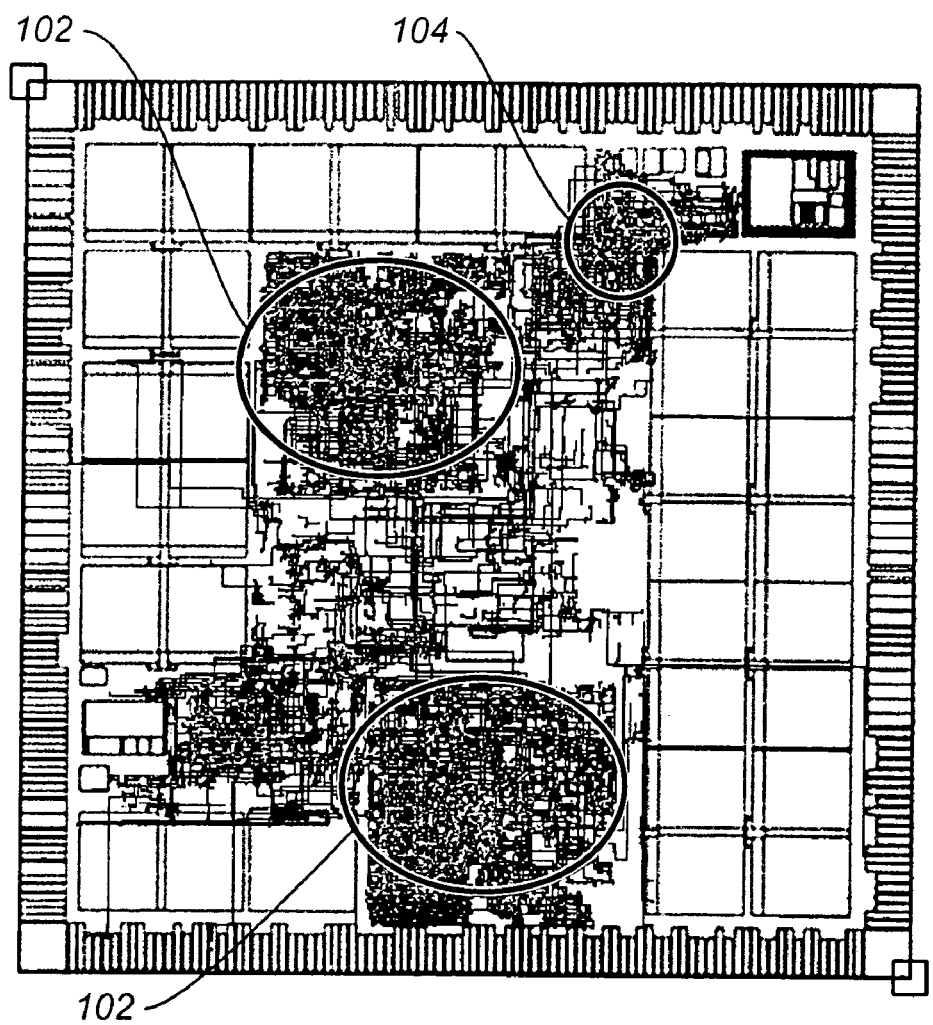
FIG._1
(PRIOR ART)

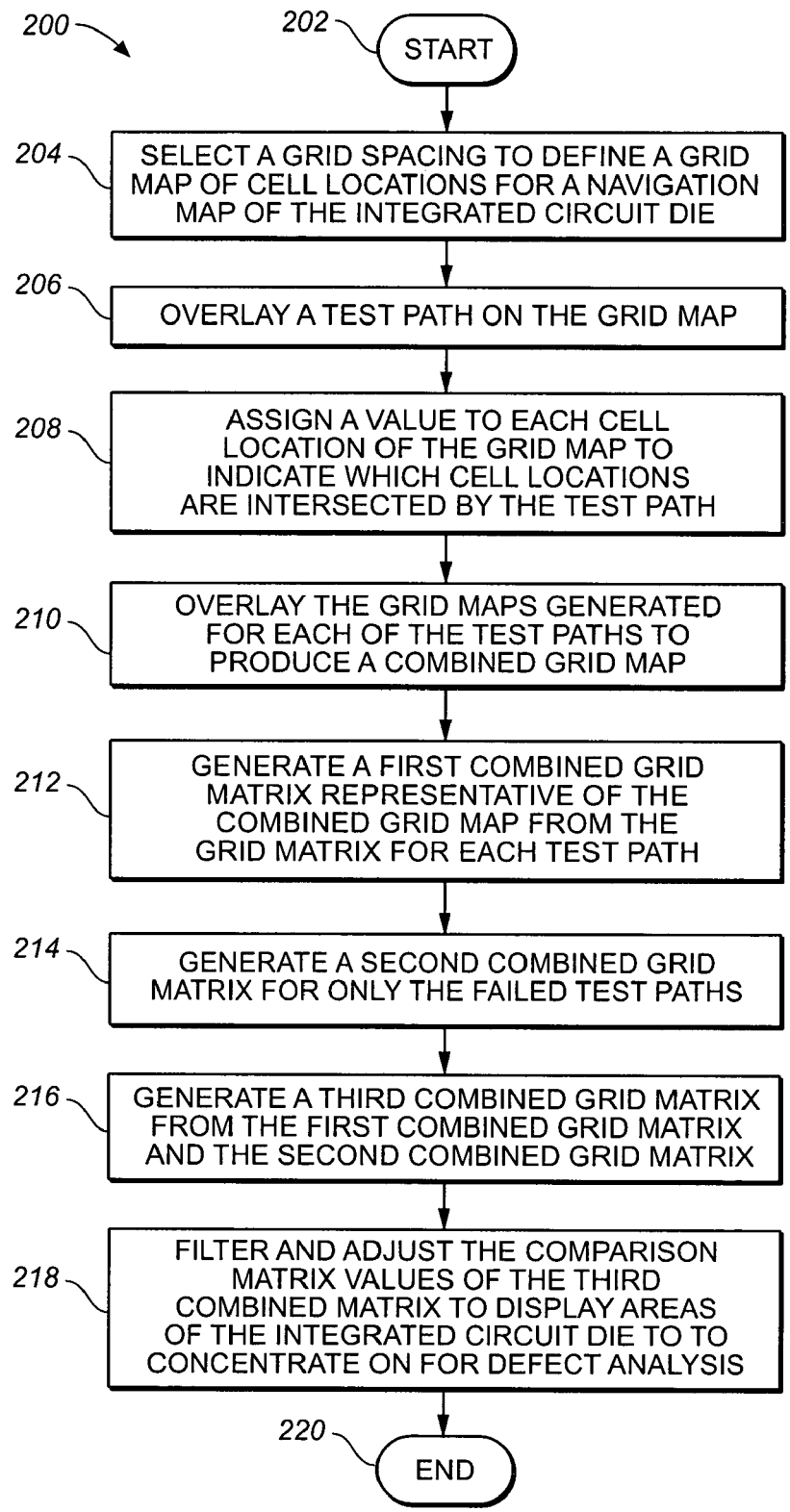
FIG._2

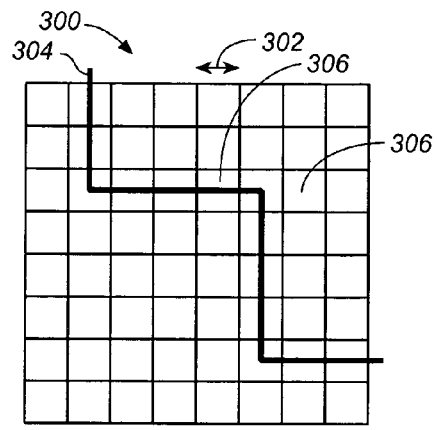
FIG._3
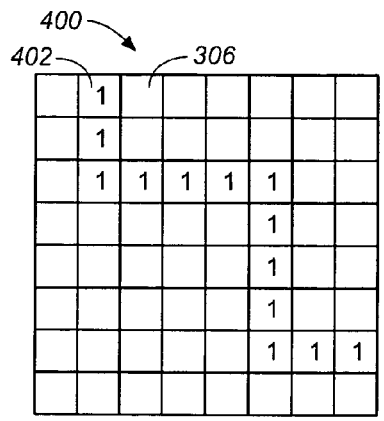
FIG._4
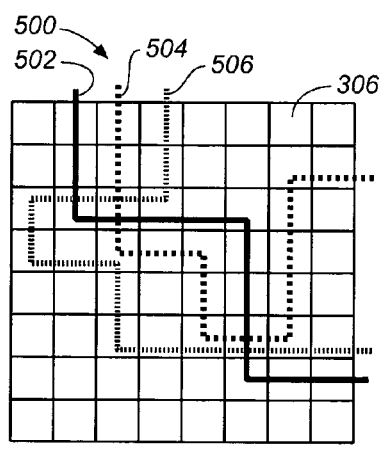
FIG._5
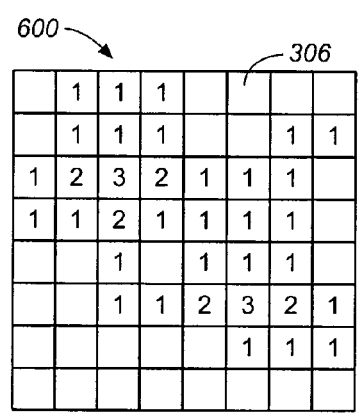
FIG._6
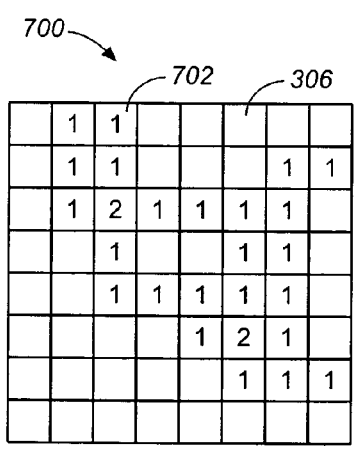
FIG._7
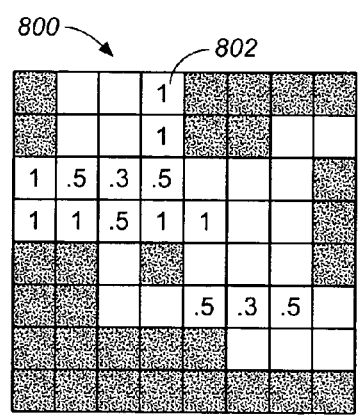
FIG._8

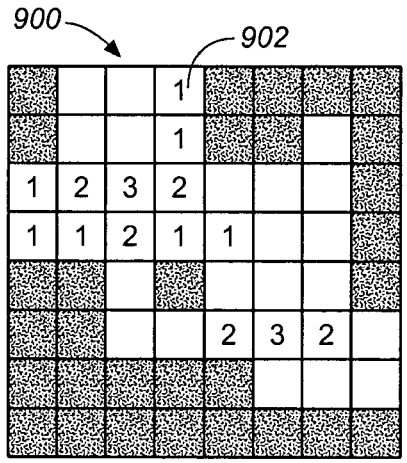
FIG._9
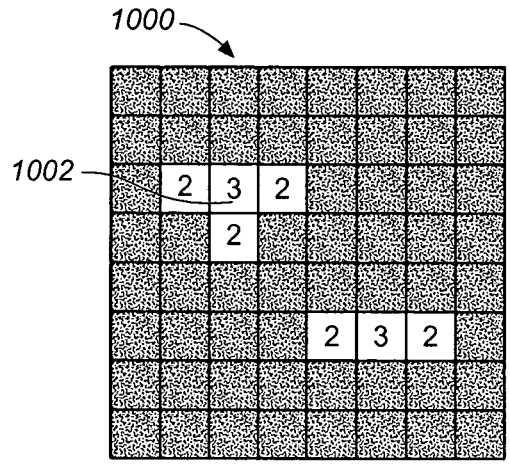
FIG._10
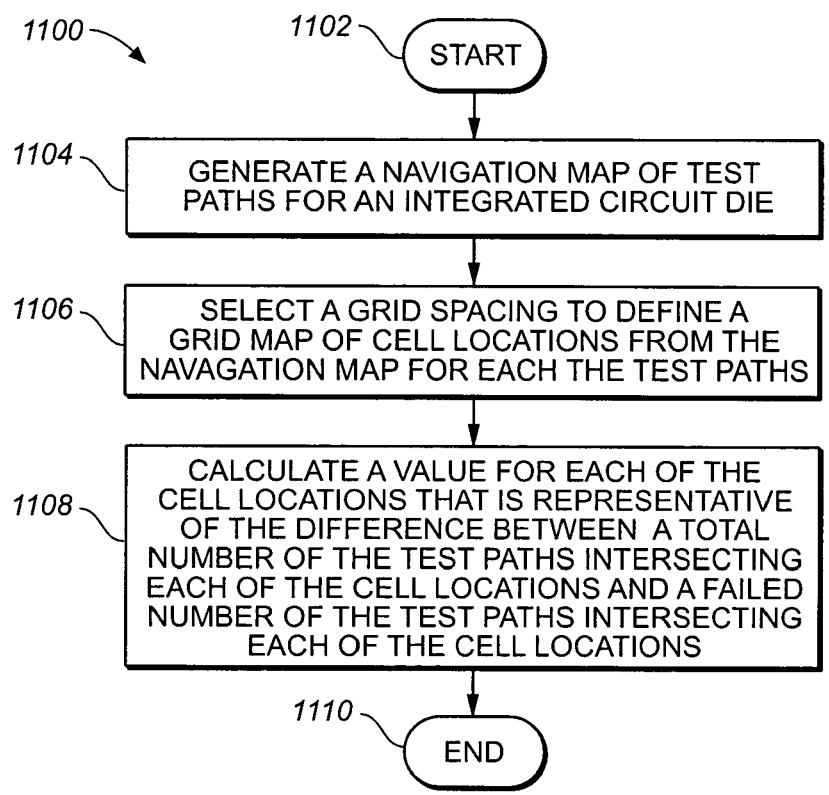
FIG._11

METHOD OF MAPPING LOGIC FAILURES IN AN INTEGRATED CIRCUIT DIE

BACKGROUND OF THE INVENTION

1. Field of the Invention

The present invention relates generally to the testing of integrated circuit dies. More specifically, but without limitation thereto, the present invention relates to mapping logic failures on an integrated circuit die to find a location of a physical feature in the integrated circuit die that is common to multiple failed test paths.

2. Description of Related Art

The combination of logic tests for specific logic paths and computer automated design (CAD) navigation tools that can map the physical paths in an integrated circuit die allows the physical path of a failed test or net across the die to be displayed and plotted. The plots from a number of tests performed on different dies for identical test paths may be combined to produce a stacked map for displaying the locations of the highest number of failures to identify physical features on the die that are most likely to be the cause of the failed nets.

SUMMARY OF THE INVENTION

In one aspect of the present invention, a method of mapping logic failures in an integrated circuit die includes steps of: (a) generating a navigation map of test paths for an integrated circuit die; (b) selecting a grid spacing to define a grid map of cell locations from the navigation map for each of the test paths; and (c) calculating a value for each of the cell locations wherein the value is representative of the difference between a total number of the test paths intersecting each of the cell locations and a failed number of the test paths intersecting each of the cell locations.

In another aspect of the present invention, a computer program product for mapping logic failures in an integrated circuit die includes:

a medium for embodying a computer program for input to a computer; and a computer program embodied in the medium for causing the computer to perform steps of:

(a) generating a navigation map of test paths for an integrated circuit die;

(b) selecting a grid spacing to define a grid map of cell locations from the navigation map for each of the test paths; and (c) calculating a value for each of the cell locations wherein the value is representative of the difference between a total number of the test paths intersecting each of the cell locations and a failed number of the test paths intersecting each of the cell locations.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates an example of a stacked map of the prior art used to locate a common cause of failure on an integrated circuit die;

FIG. 2 illustrates a flow chart for a method of mapping logic failures according to an embodiment of the present invention;

FIG. 3 illustrates a grid map according to an embodiment of the present invention;

FIG. 4 illustrates a grid matrix generated from the grid map of FIG. 3;

FIG. 5 illustrates a combined grid map representative of an overlay of multiple grid maps illustrated in FIG. 3 for multiple test paths;

FIG. 6 illustrates a first combined grid matrix generated from the grid matrices illustrated in FIG. 4 for a total number of tests;

FIG. 7 illustrates a second combined grid matrix generated from the grid matrices illustrated in FIG. 4 for a failed number of tests;

FIG. 8 illustrates a third combined grid matrix generated from the first combined grid matrix of FIG. 6 and the second combined grid matrix of FIG. 7;

FIG. 9 illustrates an inverted ratio matrix generated from the third combined grid matrix of FIG. 8;

FIG. 10 illustrates a filtered logic failure matrix generated from the inverted ratio matrix of FIG. 9; and FIG. 11 illustrates a flow chart for a method and a computer program according to embodiments of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

FIG. 1 illustrates an example of a stacked map of the prior art used to locate a common cause of failure on an integrated circuit die. Shown in FIG. 1 are locations 102 and 104 of the highest number of failed nets from a selected set of tests performed on a production lot of integrated circuit dies. Locations 102 indicate centers of logic routing areas, and location 104 is a constricted routing area between memory blocks in the floorplan of the integrated circuit die. While some of the locations 102 may be representative of a physical feature of the die that is a cause of multiple net failures in some of the locations 102, the net failures occurring in other locations 102 may be simply the result of an unusually high net density in a specific area that is more susceptible to random defects or an unusually high number of tested nets that pass through the same location 102. A disadvantage of the stacked map method illustrated in FIG. 1 is the difficulty in distinguishing those locations 102 that indicate a common cause of net failure from other locations 102 that indicate separate causes of net failure. The locations of the highest number of failed nets indicated on the stacked map may be due to other reasons, for example, an unusually high net density in a specific area of the die that is more susceptible to random defects or an unusually high number of tested nets that pass through the same part of the die.

Another disadvantage of previous methods used to localize logic failures is the time consuming calculation of tested and failed logic maps from the CAD navigation data. If the data sample is large enough to be useful, then it may be prohibitive to obtain results with practical computer resources in a reasonable amount of time.

In one aspect of the present invention, logic failures of an integrated circuit die are mapped by a method that clearly distinguishes a location of a common cause of net failure from other locations having separate causes of net failure. In one embodiment, a method of mapping logic failures in an integrated circuit die includes steps of: (a) generating a navigation map of a test paths for an integrated circuit die; (b) selecting a grid spacing to define a grid map of cell locations from the navigation map for each of the test paths; and (c) calculating a value for each of the cell locations wherein the value is representative of the difference between a total number of the test paths intersecting each of the cell locations and a failed number of the test paths intersecting each of the cell locations.

FIG. 2 illustrates a flow chart 200 for a method of mapping logic failures according to an embodiment of the present invention.

Step 202 is the entry point of the flow chart 200.

In step 204, a grid spacing is selected to define a grid map of cell locations for a navigation map of the integrated circuit die.

FIG. 3 illustrates a grid map 300 according to an embodiment of the present invention. Shown in FIG. 3 are a selected grid spacing 302, a test path 304, and cell locations 306.

The selected grid spacing 302 defines the size of the cell locations 306. The size of the cell locations 306 is preferably sufficiently small so that random defects are unlikely to occur in the same cell location 306 and so that finding a physical feature of the die within one of the cell locations 306 may be performed in a reasonable amount of time. For example, the size of each of the cell locations 306 may be selected so that the probability of more than one random defect occurring in the same cell location 306 is than a selected threshold, for example, 0.01. However, the size of each of the cell locations 306 should also be large enough so that several tested nets are likely to pass through, that is, intersect the same cell location 306. For typical integrated circuit manufacturing processes, a grid spacing 302 of about 50 to 200 microns is generally sufficient to meet these criteria.

In step 206, a test path 304 is overlaid on the grid map 300. The test path 304 may be copied to the grid map 300 from a navigation map or generated from the floorplan of the integrated circuit die according to well-known techniques. A grid map is defined in this manner for each test path 304 selected for testing the integrated circuit die.

In step 208, a value is assigned to each cell location 306 of the grid map 300 to indicate which cell locations 306 are intersected by the test path 304. The values assigned to the cell locations of the grid map 300 define a grid matrix.

FIG. 4 illustrates a grid matrix 400 generated from the grid map 300 of FIG. 3. Shown in FIG. 4 are cell locations 306 and grid matrix values 402.

In FIG. 4, each cell location 306 intersected by the test path 304 in FIG. 3 is assigned a grid matrix value 402. For example, the cell locations 306 that are intersected by the test path 304 may be assigned a value equal to one, while the cell locations 306 that are not intersected by the test path 304 may be assigned a value equal to zero, shown in FIG. 4 as a blank space. Each of the grid matrix values 402 represents an element in a row and column of the matrix shown in FIG. 4. In this example, the non-zero elements are (1,2), (2,2), (3,2), (3,3), (3,4), (3,5), (3,6), (4,6), (5,6), (6,6), (7,6), (7,7), and (7,8).

In step 210, the grid maps generated for each of the test paths are overlaid to produce a combined grid map.

FIG. 5 illustrates a combined grid map 500 representative of an overlay of multiple grid maps illustrated in FIG. 3 for multiple test paths. Shown in FIG. 5 are cell locations 306 and test paths 502, 504, and 506.

The combined grid map 500 is generated by overlaying the grid maps 300 generated for each of the test paths 502, 504, and 506. The combined grid map 500 may include the grid maps 300 for hundreds of test paths, and may also include test data of the same test paths collected from multiple die.

In the example of FIG. 5, some of the cell locations 306 are intersected by one of the test paths 502, 504, and 506, some are intersected by two of the test paths 502, 504, and 506, some are intersected by three of the test paths 502, 504, and 506, and some are intersected by none of the test paths 502, 504, and 506. There may be hundreds of test paths of the integrated circuit die that are selected for testing, and the test data may also be collected from multiple die. In this example, the test paths 502 and 504 represent failed test paths, while test path 506 represents a passed test path.

In step 212, a first combined grid matrix representative of the combined grid map 500 is generated from the grid matrix 300 of FIG. 3 for each test path.

FIG. 6 illustrates a first combined grid matrix 600 generated from the grid matrices 400 illustrated in FIG. 4 for a total number of tests.

The value of each of the cell locations 306 in the grid matrix 600 is calculated by summing the grid matrix values 402 of the corresponding elements in each of the grid matrices 400.

The grid matrices 400 for each test path 204 may be summed, for example, by a simple matrix addition that combines a list of all the tests performed on each die with the corresponding pre-calculated grid map for each test path of a given integrated circuit. The speed of the matrix addition is advantageously higher than that of plotting logic maps that typically require recalculation from data that generally only includes the endpoints of each test path or similar information. In the example of FIG. 6, the cell locations 306 at (3,2), (3,4), (4,3), (6,5), and (6,7) are each intersected by two test paths and have a corresponding summed value of two. Similarly, the cell locations 306 at (3,3) and (6,6) are each intersected by three test paths and have a corresponding summed value of three.

Further, test programs are frequently set to stop after the first logic failure to reduce test time. As a result, those nets that have been tested for a given die are not generally known in advance. Advantageously, the first combined grid matrix 600 of the present invention may be quickly calculated from actual test data. If the tested paths are identical on every die tested, that is, the tests are not stopped after fail, then the calculation of the first combined grid matrix 600 may be further simplified by multiplying the total number of die tested by the grid matrix 400 for each test path.

In step 214, the same summing procedure described above is used to generate a second combined grid matrix for only the failed test paths.

FIG. 7 illustrates a second combined grid matrix 700 generated from the grid matrices 400 illustrated in FIG. 4 for the failed test paths. Shown in FIG. 7 are cell locations 306 and summed grid matrix values 702.

In FIG. 7, the grid matrix values for only the failed test paths 502 and 504 in FIG. 5 are summed to generate the summed grid matrix values 702.

In step 216, the first combined grid matrix 600 is compared to the second combined grid matrix 700. The comparison may be performed, for example, by calculating the difference between a grid matrix value in the first combined grid matrix 600 and the corresponding grid matrix value in the second combined grid matrix 700.

FIG. 8 illustrates a third combined grid matrix generated from the first combined grid matrix of FIG. 6 and the second combined grid matrix of FIG. 7. Shown in FIG. 8 are the comparison matrix values 802.

In the illustrated example, the comparison matrix values 802 are the result of calculating the difference between the summed grid matrix values in the first combined grid matrix 600 and the corresponding elements in the second combined grid matrix 700 and dividing the difference by the total number of test paths. The smaller the comparison value 802, the higher the probability that the logic failure in the corresponding cell location 306 is common to multiple failed test paths intersecting the corresponding cell location 306 and not due to other causes of logic failures in the corresponding cell location 306. Other functions may be used to represent the comparison of the first combined grid matrix of FIG. 6 and the second combined grid matrix of FIG. 7 to suit specific applications according to well-known techniques to practice various embodiments of the present invention within the scope of the appended claims.

In step 218, the comparison matrix values 802 of the third combined matrix 800 in FIG. 8 are filtered and adjusted, for example, to display areas of the integrated circuit die to concentrate on for detect analysis. By way of example, the comparison matrix values 802 of the third combined matrix 800 in FIG. 8 may be filtered and adjusted by calculating the reciprocal of the comparison matrix values 802 from the third combined matrix 800.

FIG. 9 illustrates an inverted ratio matrix 900 generated from the third combined grid matrix of FIG. 8. Shown in FIG. 9 are the inverted ratio matrix values 902. The inverted ratio matrix values 902 are calculated from the corresponding comparison matrix values 802 of the third combined matrix 800 simply by dividing each of the non-blank comparison matrix values 802 into one. For example, the comparison matrix value at (3,4) equal to 0.5 is divided into one to generate the corresponding inverted ratio matrix value 2, and so on.

FIG. 10 illustrates a filtered logic failure matrix 1000 generated from the inverted ratio matrix of FIG. 9. Shown in FIG. 10 are the filtered logic failure matrix values 1002.

In the example of FIG. 10, the filtered logic failure matrix values 1002 are generated by removing elements from the inverted ratio matrix of FIG. 9 that have a value below a selected threshold, for example, two. The remaining values may then be displayed to direct attention to the specific areas of the integrated circuit die that indicate a physical feature of the integrated circuit die that is a common cause of logic failure.

Step 220 is the exit point of the flow chart 200.

FIG. 11 illustrates a flow chart 1100 for a method and a computer program according to embodiments of the present invention.

Step 1102 is the entry point of the flow chart 1100.

In step 1104, a navigation map of test paths for an integrated circuit die is generated according to well-known techniques.

In step 1106, a grid spacing is selected to define a grid map of cell locations from the navigation map for each of the test paths as described above with reference to the grid map 300 of FIG. 3.

In step 1108, a value is calculated for each of the cell locations. Each value is representative of the difference between a total number of the test paths intersecting each of the cell locations and a failed number of the test paths intersecting each of the cell locations as described above with reference to the comparison matrix 800 of FIG. 8.

Step 1110 is the exit point of the flow chart 1100.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow chart 1100 may also be implemented by instructions performed on a computer according to well-known programming techniques.

In another aspect of the present invention, a computer program product for mapping logic failures in an integrated circuit die includes:

a medium for embodying a computer program for input to a computer; and a computer program embodied in the medium for causing the computer to perform steps of:

(a) generating a navigation map of test paths for an integrated circuit die;

(b) selecting a grid spacing to define a grid map of cell locations from the navigation map for each of the test paths; and (c) calculating a value for each of the cell locations wherein the value is representative of the difference between a total number of the test paths intersecting the cell location and a failed number of the test paths intersecting the cell location.

While the invention herein disclosed has been described by means of specific embodiments and applications thereof, numerous modifications and variations could be made thereto by those skilled in the art without departing from the scope of the invention set forth in the following claims.

What is claimed is:

1. A method of mapping logic failures in an integrated circuit die comprising steps of:
   (a) generating a navigation map of test paths for an integrated circuit die;
   (b) selecting a grid spacing to define a grid map of cell locations from the navigation map for each of the test paths; and
   (c) calculating a value for each of the cell locations wherein the value is representative of the difference between a total number of the test paths intersecting each of the cell locations and a failed number of the test paths intersecting each of the cell locations.

2. The method of claim 1 wherein step (b) further comprises selecting the grid spacing so that a probability of multiple random defects occurring in an identical one of the cell locations is less than a selected threshold.

3. The method of claim 1 wherein step (b) further comprises a step of selecting the grid spacing of 50 to 200 microns.

4. The method of claim 1 wherein step (c) further comprises assigning a first value to each cell location in a grid map that is intersected by one of the test paths and assigning a second value to each cell location in the grid map that is not intersected by one of the test paths to define a grid matrix for each grid map.

5. The method of claim 4 wherein step (c) further comprises generating a first combined grid matrix equal to a sum of the grid matrix for each of the total number of the test paths.

6. The method of claim 4 wherein step (c) further comprises generating a second combined grid matrix equal to a sum of the grid map for each of the failed number of the test paths.

7. The method of claim 6 wherein step (c) further comprises generating a third combined grid matrix representative of a difference between the first combined grid matrix and the second combined grid matrix.

8. The method of claim 7 wherein step (c) further comprises dividing each element of the third combined grid matrix by the total number of the test paths.

9. The method of claim 1 further comprising filtering the value for each of the cell locations to remove values for the cell locations that contain a number of logic failures below a selected threshold to generate a filtered comparison matrix.

10. The method of claim 9 further comprising displaying the filtered comparison matrix to identify the cell locations of logic failures that are related to a common physical feature of the integrated circuit die.

11. A computer program product for mapping logic failures in an integrated circuit die comprising:
   a medium for embodying a computer program for input to a computer; and
   a computer program embodied in the medium for causing the computer to perform steps of:
   (a) generating a navigation map of test paths for an integrated circuit die;
   (b) selecting a grid spacing to define a grid map of cell locations from the navigation map for each of the test paths; and
   (c) calculating a value for each of the cell locations wherein the value is representative of the difference between a total number of the test paths intersecting each of the cell locations and a failed number of the test paths intersecting each of the cell locations.

12. The computer program product of claim 11 wherein step (b) further comprises selecting the grid spacing so that a probability of multiple random defects occurring at an identical one of the cell locations is less than a selected threshold.

13. The computer program product of claim 11 wherein step (b) further comprises a step of selecting the grid spacing of 50 to 200 microns.

14. The computer program product of claim 11 wherein step (c) further comprises assigning a first value to each cell location in each grid map that is intersected by one of the test paths and assigning a second value to each of the cell locations in each grid map that is not intersected by one of the test paths to define a grid matrix for each grid map.

15. The computer program product of claim 14 wherein step (c) further comprises generating a first combined grid matrix equal to a sum of the grid map for each of the test paths.

16. The computer program product of claim 15 wherein step (c) further comprises generating a second combined grid matrix equal to a sum of the grid map for each of the failed number of the test paths.

17. The computer program product of claim 16 wherein step (c) further comprises generating a third combined grid matrix representative of a difference between the first combined grid matrix and the second combined grid matrix.

18. The computer program product of claim 17 wherein step (c) further comprises dividing each element of the third combined grid matrix by the total number of the test paths.

19. The computer program product of claim 11 further comprising filtering the value for each of the cell locations to remove values for the cell locations that contain a number of logic failures below a selected threshold to generate a filtered comparison matrix.

20. The computer program product of claim 19 further comprising displaying the filtered comparison matrix to identify the cell locations of logic failures that are related to a common physical feature of the integrated circuit die.

* * * * *